(12) United States Patent
Lin et al.

(10) Patent No.: US 9,223,145 B2
(45) Date of Patent: Dec. 29, 2015

(54) DEVICE FOR ASSEMBLING CAMERA MODULE HAVING ANISOTROPIC CONDUCTIVE FILM

(71) Applicants: HONG FU JIN PRECISION INDUSTRY (ShenZhen) CO., LTD., Shenzhen (TW); HON HAI PRECISION INDUSTRY CO., LTD., New Taipei (TW)

(72) Inventors: Yu-Shu Lin, New Taipei (TW); Fang Ye, Shenzhen (CN); Chien-Liang Chou, New Taipei (TW); Shin-Wen Chen, New Taipei (TW)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 237 days.

(21) Appl. No.: 14/066,710

(22) Filed: Oct. 30, 2013

(65) Prior Publication Data

US 2014/0310952 A1    Oct. 23, 2014

(30) Foreign Application Priority Data

Apr. 22, 2013 (CN) .......................... 2013 1 0139775

(51) Int. Cl.
| | |
|---|---|
| *B23P 19/00* | (2006.01) |
| *H05K 13/04* | (2006.01) |
| *G02B 27/62* | (2006.01) |
| *H05K 13/00* | (2006.01) |

(52) U.S. Cl.
CPC ............ *G02B 27/62* (2013.01); *H05K 13/0023* (2013.01); *Y10T 29/5313* (2015.01); *Y10T 29/53091* (2015.01); *Y10T 29/53187* (2015.01); *Y10T 29/53465* (2015.01)

(58) Field of Classification Search
CPC ............... G02B 27/62; H05K 13/0023; Y10T 29/53091; Y10T 29/5313; Y10T 29/53187; Y10T 29/53465
USPC ................................ 29/729, 739; 361/679.01
See application file for complete search history.

(56) References Cited

U.S. PATENT DOCUMENTS

| | | | | |
|---|---|---|---|---|
| 6,223,667 | B1* | 5/2001 | Ono et al. ................. | 112/470.34 |
| 7,926,159 | B2* | 4/2011 | Tsai ........................... | 29/407.04 |
| 8,248,523 | B2* | 8/2012 | Chua et al. ................. | 348/374 |
| 8,976,291 | B2* | 3/2015 | Chen .......................... | 348/374 |
| 2010/0246928 | A1* | 9/2010 | Takahama et al. ........... | 382/140 |
| 2014/0053986 | A1* | 2/2014 | Chou et al. .................. | 156/580 |
| 2014/0059822 | A1* | 3/2014 | Chen et al. .................. | 29/38.9 |

* cited by examiner

*Primary Examiner* — Paul D Kim
(74) *Attorney, Agent, or Firm* — Novak Druce Connolly Bove + Quigg LLP

(57) ABSTRACT

A device for assembling a camera module includes a support base, a pressing head, a buffer tape, a winding device, a driver, and a controller. The support base is for supporting the camera module. The camera module includes a ceramic substrate positioned on the support base and an anisotropic conductive film (ACF) pasted on the ceramic substrate. The pressing head is positioned above the ACF and is configured to pressing the ACF. The buffer tape is positioned between the pressing head and the ACF. The winding device includes a winding-out roller and a winding-in roller. The buffer tape is wound on the winding-out roller. The controller is configured to control the driver to drive the winding device to wind the buffer tape out from the winding-out roller and into the winding-in roller in a predetermined manner.

12 Claims, 3 Drawing Sheets

DEVICE FOR ASSEMBLING CAMERA MODULE HAVING ANISOTROPIC CONDUCTIVE FILM

BACKGROUND

1. Technical Field

The present disclosure relates to camera modules and, particularly, to a device for assembling a camera module that includes an anisotropic conductive film (ACF).

2. Description of Related Art

Camera modules include a ceramic substrate and an ACF pasted to the ceramic substrate. In assembly, a pressing head is employed to press the ACF to firmly fix the ACF on the ceramic substrate. To protect the ceramic substrate from being damaged and increase smoothness of the ACF, a buffer tape is positioned between the pressing head and the ACF to buffer the pressing. However, after times of pressing, an elasticity of the buffer tape reduces and, as consequence, the buffer tape cannot efficiently buffer the pressing any more and needs to be replaced. At present, the replacement is finished by manual operations, which are carried out under varying criteria, especially given that the human element is involved, and is an inefficient use of man-power and resources.

Therefore, it is desirable to provide a device for assembling a camera module that can overcome the above-mentioned problems.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Embodiments of the present disclosure will be described with reference to the drawings.

Figure 1:
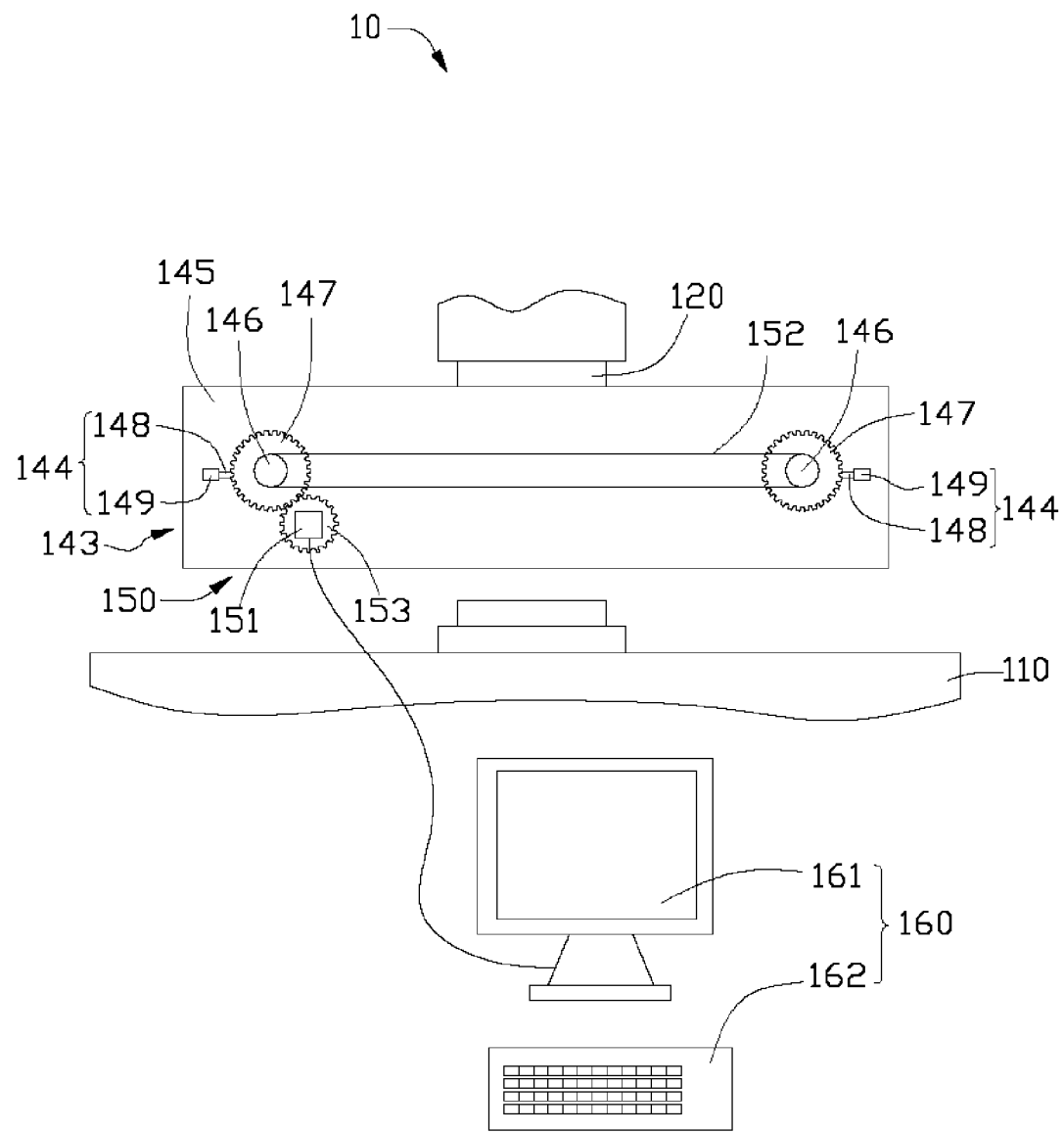
FIG. 1 is a planar schematic view of a device for assembling a camera module in accordance with an embodiment.
Figure 2:
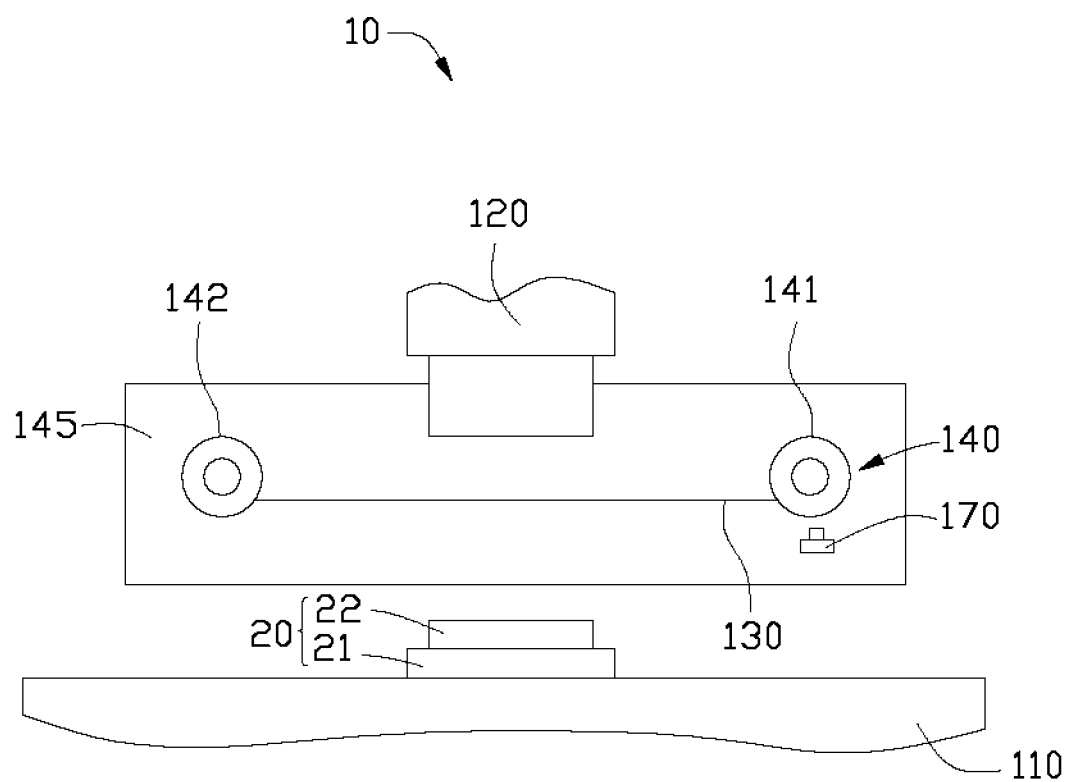
FIG. 2 is a partial view of the device and the camera module of FIG. 1.

FIGS. 1-2 show a device 10 for assembling a camera module 20, according to an embodiment. The device 10 includes a support base 110, a pressing head 120, a buffer tape 130, a winding device 140, a driver 150, and a controller 160. The camera module 20 includes a ceramic substrate 21 and an ACF 22 pasted on the ceramic substrate 21.

The support base 110 can be positioned in a producing line (not shown) of the camera module 20. As such, the camera module 20 can come into and be supported on the support base 110 for pressing when being transported along the producing line. The ACF 22 faces away from the support base 110 when the camera module 20 is supported on the support base 110.

The pressing head 120 is positioned above the support base 110 and is connected to a mechanical arm (not shown) and can be driven by the mechanical arm to move toward the support base 100 to press the camera module 20.

The buffer tape 130 is made of silicon and positioned between the pressing head 120 on the ACF 22. In practice, the buffer tape 130 is stretched above the ACF 22.

The winding device 140 is configured for winding the buffer tape 130. In practice, the buffer tape 130 is often long enough to be used hundreds and thousands times. The winding device 140 includes a winding-out roller 141 and a winding-in roller 142. Before use, the buffer tape 130 is wound on the winding-out roller 141 and, when in use, the buffer tape 130 is wound out from the winding-out roller 141 and into the winding-in roller 142.

The winding device 140 also includes a bracket 143 and a lock structure 144.

The bracket 143 is positioned above the support base 110 and includes two supporting boards 145 standing in parallel. The winding-out roller 141 and the winding-in roller 142 are positioned between the supporting boards 145 and rotating axis (not labeled) of the winding-out roller 141 and the winding-in roller 142 are substantially perpendicular with the supporting boards 145.

The locking structure 144 is configured for locking the winding-out roller 141 and the winding-in roller 142 to prevent the winding-out roller 141 and the winding-in roller 142 from being rotating with respective with the supporting boards 145. As such, the buffer tape 130 is stretched above the ACF 22 by the winding-out roller 141 and the winding-in roller 142.

The lock structure 144 is also configured for unlocking the winding-out roller 141 and the winding-in roller 142 to allow the winding-out roller 141 and the winding-in roller 142 to rotate with respective with the supporting boards 145. As such, the buffer tape 130 can be wound by the winding device 140 to replace a pressed portion of the buffer tape 130 with a new portion.

Each of the winding-out roller 141 and the winding-in roller 142 includes a shaft 146 protruding out from one of the supporting boards 145. The winding device 140 also includes two first gears 147, each of which is formed on the shaft 146. The lock structure 144 includes two pins 148, each of which is movably positioned adjacent to one of the first gears 147. The lock structure 144 also includes two actuators 149, each of which is configured to drive one of the pins 148 to move towards the corresponding first gear 147 to insert into and thus lock the first gear 147. Each actuator 149 is also configured to drive the corresponding pin 148 to move away from the corresponding first gear 147 to disengage with and thus unlock the first gear 147. The actuators 149 can be linear motors.

However, the lock structure 144 is not limited to this embodiment but can take other suitable forms in other embodiments.

The driver 150 is configured to drive the winding device 140 to wind the buffer tape 130 and includes a motor 151 and a belt 152. The motor 151, such as a step motor, includes a second gear 153, which is engaged with one of the first gear 147 (for example, the first gear 147 that is located adjacent to the winding-out roller 141). The belt 152 is stretched and sleeved on the shafts 146. As such, the motor 151 can drive the winding-out roller 141 to rotate via engagement between the first gear 147 and the second gear 148, and also drive the winding-in roller 141 to rotate via engagement between the belt and the shafts 146.

However, the driver 150 is not limited to this embodiment and can take other suitable forms in other embodiments.

Figure 3:
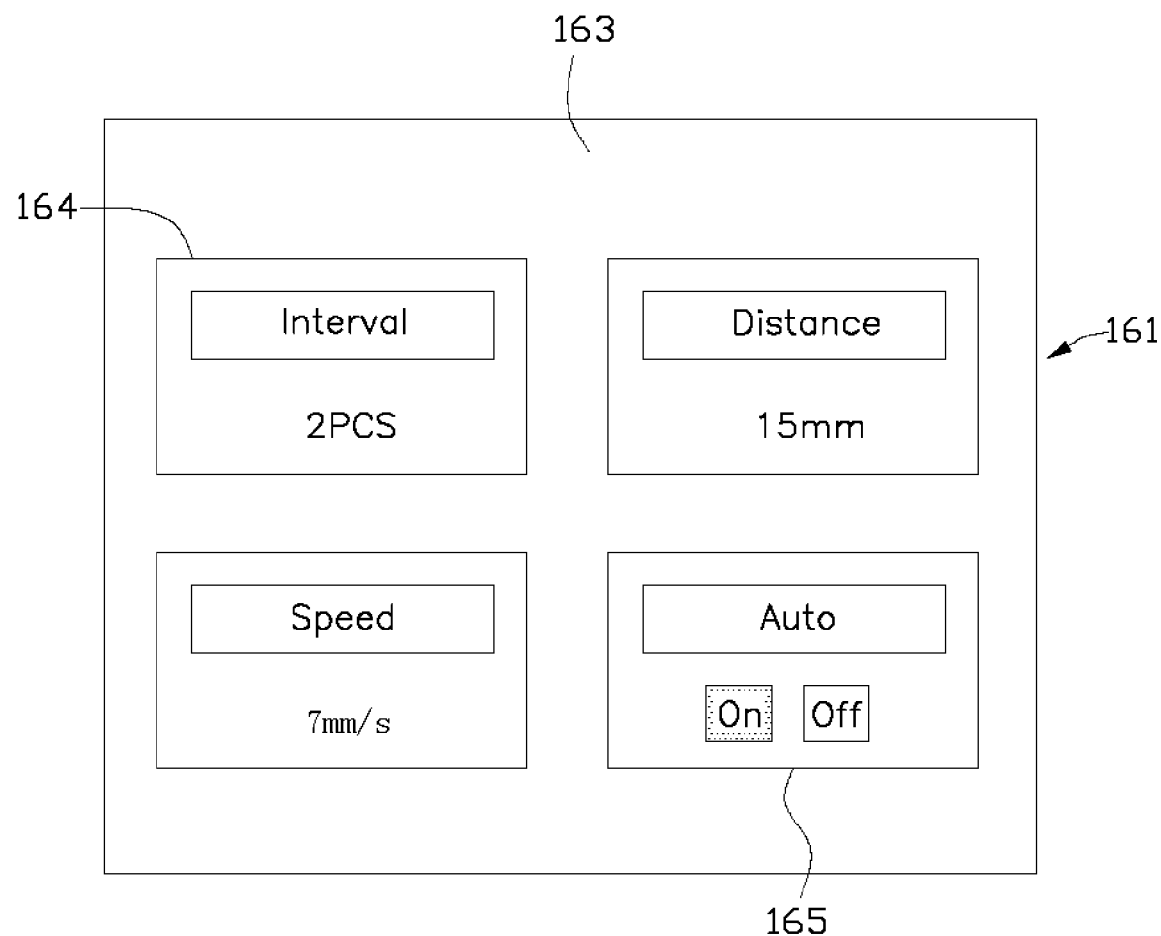
FIG. 3 is a schematic view of a user interface of the device of FIG. 1.

The controller 160 can be a computer that includes a display 161 and an input device 162. FIG. 3 shows a view of a user interface 163 on the display 161. The user interface 163 includes a number of setting columns 164, such as, interval, speed, and distance, which can be set by operating the input device 162. Thus, time interval of replacement, rotating speed of the winding device 140, and moving distance of the buffer tape 130 in each replacement can be determined.

The controller 160 can also include a switch 165. The switch 165 is for turning on/off the automatic replacement function. In this embodiment, the switch 165 is a virtual button shown on the user interface and can be activated via the input device 162.

However, the controller 160 is not limited to this embodiment but can take other suitable forms in other embodiments.

The device 10 also includes a sensor 170 for detecting if the all of the buffer tape 130 is used. In this embodiment, the sensor 170 is a thickness detector positioned adjacent to the winding-in roller 142 to detect if a thickness of the buffer tape 130 wound on the winding-in roller 142 is larger than a predetermined value. If yes, it is determined that all of the buffer tape 130 is used and warnings are issued.

It will be understood that the above particular embodiments are shown and described by way of illustration only. The principles and the features of the present disclosure may be employed in various and numerous embodiments thereof without departing from the scope of the disclosure. The above-described embodiments illustrate the possible scope of the disclosure but do not restrict the scope of the disclosure.

What is claimed is:

1. A device for assembling a camera module, comprising:
    a support base for supporting the camera module, the camera module comprising a ceramic substrate positioned on the support base and an anisotropic conductive film (ACF) pasted on the ceramic substrate;
    a pressing head positioned above the ACF and configured to pressing the ACF;
    a buffer tape positioned between the pressing head and the ACF;
    a winding device comprising a winding-out roller and a winding-in roller, the buffer tape being wound on the winding-out roller;
    a driver; and
    a controller configured to control the driver to drive the winding device to wind the buffer tape out from the winding-out roller and into the winding-in roller in a predetermined manner to replace a portion of the buffer tape pressed by the pressing head.

2. The device of claim 1, wherein the buffer tape is made silicon.

3. The device of claim 1, wherein the winding device comprises a bracket, the bracket is positioned above the support base and includes two supporting boards standing in parallel, and the winding-out roller and the winding-in roller are positioned between the supporting boards and rotate about a direction that is substantially perpendicular with the supporting boards.

4. The device of claim 3, wherein the winding device comprises a locking structure, the locking structure is configured for locking the winding-out roller and the winding-in roller to prevent the winding-out roller and the winding-in roller from being rotating with respective with the supporting boards, and the lock structure is also configured for unlocking the winding-out roller and the winding-in roller to allow the winding-out roller and the winding-in roller to rotate with respective with the supporting boards.

5. The device of claim 4, wherein each of the winding-out roller and the winding-in roller comprises a shaft protruding out from one of the supporting boards, the winding device also comprises two first gears, each of which is formed on the shaft, the lock structure comprises two pins, each of which is movably positioned adjacent to one of the first gears, the lock structure also comprises two actuators, each of which is configured to drive one of the pins to move towards the corresponding first gear to insert into and thus lock the first gear, each actuator is also configured to drive the corresponding pin to move away from the corresponding first gear to disengage with and thus unlock the first gear.

6. The device of claim 5, wherein the actuators are linear motors.

7. The device of claim 5, wherein the driver comprises a motor and a belt, and the motor comprises a second gear, which is engaged with one of the first gear, the belt is stretched and sleeved on the shafts.

8. The device of claim 7, wherein the motor is step motor.

9. The device of claim 1, wherein the controller comprise a display and an input device, the device is configured to show a view of an user interface, the user interface comprises a number of setting columns for setting a time interval of replacement, rotating speed of the winding device, and moving distance of the buffer tape in each replacement by operating the input device.

10. The device of claim 1, wherein the controller comprises a switch, the switch is configured to turn on and off the automatic replacement function for the buffer tape.

11. The device of claim 1, further comprising a sensor for detecting if the all of the buffer tape is used.

12. The device of claim 11, wherein the sensor is a thickness detector positioned adjacent to the winding-in roller to detect if a thickness of the buffer tape wound on the winding-in roller is larger than a predetermined value, and it is determined that all of the buffer tape is used when the thickness of the buffer tape wound on the winding-in roller is larger than a predetermined value.

* * * * *